US009712082B2

(12) United States Patent
Manchia

(10) Patent No.: US 9,712,082 B2
(45) Date of Patent: Jul. 18, 2017

(54) METHOD FOR ACQUIRING VALUES INDICATIVE OF AN AC CURRENT OF AN INVERTER AND RELATED CIRCUIT AND INVERTER

(71) Applicant: ABB Technology AG, Zurich (CH)

(72) Inventor: Giovanni Manchia, Terranuova Bracciolini (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/138,790

(22) Filed: Apr. 26, 2016

(65) Prior Publication Data
US 2016/0315556 A1 Oct. 27, 2016

(30) Foreign Application Priority Data

Apr. 27, 2015 (EP) ..................................... 15165225

(51) Int. Cl.
*H02M 3/335* (2006.01)
*H02M 7/44* (2006.01)
*H02M 1/08* (2006.01)
*G01R 19/00* (2006.01)
*H02M 1/42* (2007.01)
(Continued)

(52) U.S. Cl.
CPC .......... *H02M 7/44* (2013.01); *G01R 19/0092* (2013.01); *H02M 1/08* (2013.01); *H02M 1/4233* (2013.01); *H02M 7/53871* (2013.01); *H02M 2001/0009* (2013.01)

(58) Field of Classification Search
CPC .... H02M 3/33523; H02M 1/36; H02M 7/219; H02M 2001/0009; H02M 7/44; H02J 3/385

USPC ........ 363/17, 24, 37, 39, 40, 41, 84, 89, 97, 363/98, 132; 323/207, 205, 901, 324
See application file for complete search history.

(56) References Cited

U.S. PATENT DOCUMENTS 4,672,555 A * 6/1987 Hart ....................... G01R 19/25
324/142
6,154,379 A * 11/2000 Okita ....................... H02M 7/48
363/40
(Continued)

OTHER PUBLICATIONS

European Search Report, EP15165225.2, ABB Technology AG, Oct. 12, 2015.
(Continued)

*Primary Examiner* — Rajnikant Patel
(74) *Attorney, Agent, or Firm* — Taft Stettinius & Hollister LLP

(57) ABSTRACT

A method for acquiring values indicative of an AC current generable by an inverting stage of an inverter. The method includes at least a first line and a second line for providing a path for AC current between the inverting stage and the output stage. A current sensor is operatively associated to the first and second lines and configured in such a way to generate a signal as a function of the sum between the AC current flowing in the first line and the AC current flowing in the second line. The method may also include driving the inverting stage in such a way that the AC current in the first line has a first high-frequency ripple during a first-half of the current period, and in such a way that the AC current in the second line has a second high-frequency ripple during a second-half of the current period.

20 Claims, 9 Drawing Sheets

(51) Int. Cl.
*H02M 7/5387* (2007.01)
*H02M 1/00* (2006.01)

(56) References Cited

U.S. PATENT DOCUMENTS

| | | | | |
|---|---|---|---|---|
| 6,239,997 | B1* | 5/2001 | Deng | H02J 3/38 363/95 |
| 8,674,668 | B2* | 3/2014 | Chisenga | H02M 3/156 323/266 |
| 9,413,270 | B2* | 8/2016 | Liu | H02M 1/40 |
| 2009/0201703 | A1 | 8/2009 | Klikic et al. | |

OTHER PUBLICATIONS

Jiang, et al., Grid-Connected Boost-Half-Bridge Photovoltaic Microinverter System Using Repetitive Curent Control and Maximum power Point Tracking, IEE, vol. 27, No. 11, Nov. 1, 2012, 12 pages.

Holmes, et al., An Innovative, Efficient Current-Fed Push-Pull Grid Connectable Inverter for Distributed Generation Systems, PESC 2006, 37th IEEE JEJU, Korea, Jun. 18-22, 2006, 7 pages.

\* cited by examiner

METHOD FOR ACQUIRING VALUES INDICATIVE OF AN AC CURRENT OF AN INVERTER AND RELATED CIRCUIT AND INVERTER

The present invention relates to a method for measuring values of an AC current generable by the inverting stage of an inverter, through the acquisition of electrical values indicative of such AC current. The present invention also relates to a circuit which is adapted to be used in an inverter for carrying out the above method, and to the inverter which comprises such circuit.

As known, inverters are power electric devices used in several technical fields, among which renewable energy applications, such as solar or wind applications.

An inverter generally comprises:
  an input stage having connection means adapted to be operatively connected to one or more DC ("direct current") electrical sources;
  power conversion means adapted to convert the DC power received from the DC sources to an AC power; and
  an output stage having connection means adapted to be operatively connected to one or more AC ("alternated current") electrical grids and/or loads.

In particular, the inverter is adapted to work according to a grid connected mode where it is connected to the AC grid by means of the output stage, or according to a stand-alone mode where it is connected to one or more AC loads by means of the output stage.

The power conversion means generally comprises a DC/DC conversion stage, e.g. a booster stage, for receiving in input the DC power, followed by an inverting stage which is adapted to be driven by control means for generating an AC current.

A first line and a second line define a current path for the generated AC current, between the inverting stage and the output stage. In this way, the generated AC current can:
  flow through the first line from the inverting stage to the output stage, so as it can reach and flow through the AC load or grid connected to the output stage;
  return from the AC load or grid towards the inverting stage by flowing in the second line.

According to a known AC power generation technique applied to single-phase inverters, the control means are adapted to control the inverting stage in such a way that:
  the generated AC current, while flowing in the first line, comprises a first high-frequency ripple during a first-half of the AC current period, but it does not comprise a high-frequency ripple content during the second-half half of the AC current period;
  the generated AC current, while flowing in the second line, comprises a second high-frequency ripple during the second-half of AC current period, but it does not comprise a high-frequency ripple during the first-half of the AC period.

For the purpose of the present application, the term "high frequency ripple" means a periodic variation superimposed to the sinusoidal behavior of the AC current, having a frequency greater than the sinusoidal frequency of the AC current (sinusoidal frequency which has typically a value of 50 Hz or 60 Hz, as required by the AC grid or load).

The inverter further comprises filtering means which are adapted to filter at the output stage, according to known solutions, the high frequency ripple content of the AC current flowing in the first and second lines. In this way, the high frequency ripple of the AC current flowing in the first and second lines does not flow through the load or grid connected to the output stage.

A solution for measuring the generated AC current through values sampling is also known, for example in view of acquiring feedback current measurements for feeding the control algorithm which controls the generation of the AC current through the inverting stage.

As known, the sampling operation is carried out with greater accuracy on signals having high slope, such as the high slope associated to the high frequency ripple content of the AC current.

In order to perform an accurate sampling even in this situation, two current sensors are used: a first current sensor and a second current sensor which are operatively associated to the first line and the second line, respectively. In this way, the first current sensor can output a first signal in response to the AC current flowing in the first line and the second current sensor can output a second signal in response to the AC current flowing in the second line.

The first and second outputted signals have the same period of the sensed AC current flowing in the first and second line.

Further, the first outputted signal has a high frequency ripple, corresponding to the current ripple at each first-half period of the AC current while flowing in the first line; hence, the first outputted signal can be suitably sampled during each of its first-half periods, where it has a high slope.

Also the second outputted signal has a high frequency ripple, corresponding to the current ripple at each second-half period of the AC current while flowing in the second line; hence, the second outputted signal can be suitably sampled during each of its second-half periods, where it has a high slope.

The use of two current sensors is expensive.

In light of above, at the current state of the art, although known solutions perform in a rather satisfying way from, there is still reason and desire for further improvements.

Such desire is fulfilled by a method for acquiring values indicative of an AC current generable by an inverting stage of an inverter. The inverter comprises:
  an output stage adapted to be operatively connected to one or more AC grids or loads;
  at least a first line and a second line for providing a path for the AC current between the inverting stage and the output stage;
  a current sensor operatively associated to the first line and the second line and configured in such a way to generate a signal as a function of the sum between the AC current flowing in the first line and the AC current flowing in the second line.

The method comprises:
a) driving the inverting stage for generating the AC current in such a way that the AC current, while flowing in the first line, comprises a first high-frequency ripple during a first-half of the period of the AC current, and in such a way that said AC current, while flowing in the second line, comprises a second high-frequency ripple during a second-half of the period of the AC current; and
b) generating through the current sensor a signal as a function of the sum between the AC current flowing in the first line and the AC current flowing in the second line; and
c) sampling values of the generated signal during the first-half period and the second-half period.

Another aspect of the present invention is to provide a method for controlling an inverter. The inverter comprising:
  an inverting stage adapted to generate an AC current;
  an output stage adapted to be electrically connected to one or more AC grids or loads;
  at least a first line and a second line for providing a path for the AC current between the inverting stage and the output stage; and a current sensor operatively associated to the first line and the second line and configured in such a way to generate a signal as a function of the sum between the AC current flowing in the first line and the AC current flowing in the second line.

The control method comprises:
acquiring values indicative of the AC current through the execution of the acquiring method as defined by the annexed claims and disclosed in the following description; and
using the acquired values for providing feedback measurements for controlling the generation of the AC current by the inverting stage.

Another aspect of the present invention is to provide a circuit for an inverter, the inverter comprising at least an inverting stage adapted to generate an AC current and an output stage adapted to be operatively connected to one or more AC electrical girds or loads. The circuit comprises at least a first line and a second line for providing a path for the AC current between the inverting stage and the output stage. The circuit further comprises a current sensor which is operatively associated to the first and second lines and configured in such a way to generate a signal as a function of the sum between the AC current flowing in the first line and the AC current flowing in the second line.

Another aspect of the present invention is to provide an inverter comprising at least:
an inverting stage adapted to generate an AC current;
an output stage adapted to be operatively connected to one or more AC electrical grids or loads;
control means adapted to control the inverting stage;
a circuit as defined by the annexed claims and disclosed in the following disclosure.

The control means are adapted to control the inverting stage in such a way that the AC current, while flowing in the first line of the circuit, comprises a first high-frequency ripple during a first-half of the period of the AC current, and in such a way that the AC current, while flowing in the second line, comprises a second high frequency ripple during a second-half of the period of the AC current. The inverter further comprises means for sampling values of the signal generated by the current sensor during the first-half period and the second-half period.

A final aspect of the present invention is to provide an electrical system comprising at least one inverter as the inverter defined by the annexed claims and disclosed in the following description, such a power generation plant (e.g. a solar or wind power generation plant).

Further characteristics and advantages will become more apparent from the description of preferred but not exclusive embodiments of the acquiring method, control method, circuit, and inverter according to the present invention, illustrated only by way of non-limiting examples with the aid of the accompanying drawings, wherein.

Figure 1:
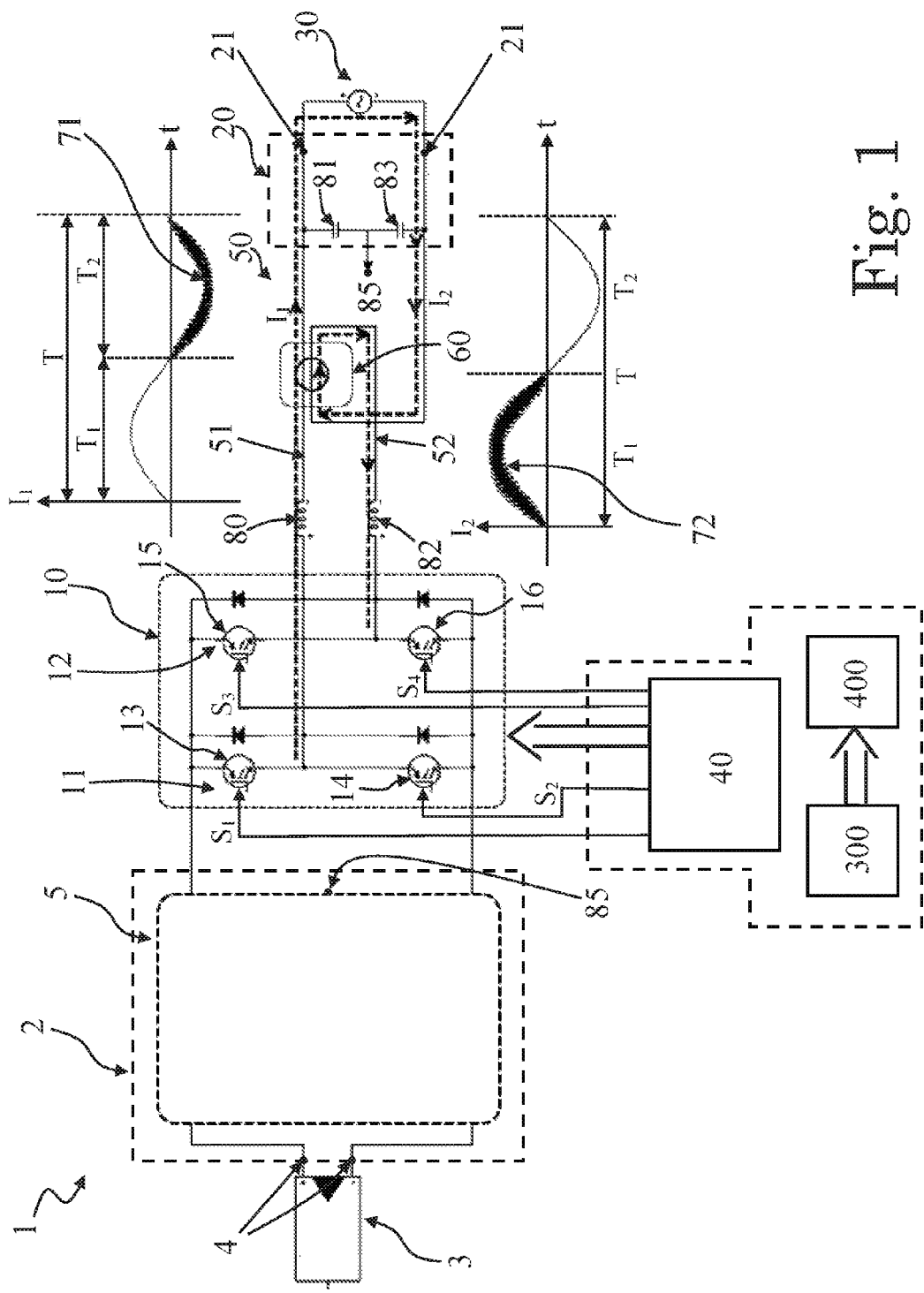
FIG. 1 illustrates the electrical schematic of an inverter according to the present invention.

It should be noted that in the detailed description that follows, identical or similar components, either from a structural and/or functional point of view, have the same reference numerals, regardless of whether they are shown in different embodiments of the present disclosure; it should also be noted that in order to clearly and concisely describe the present disclosure, the drawings may not necessarily be to scale and certain features of the disclosure may be shown in somewhat schematic form.

Further, when the term "adapted" or "arranged" or "configured" or "suitable", is used herein while referring to any component as a whole, or to any part of a component, or to a whole combinations of components, or even to any part of a combination of components, it has to be understood that it means and encompasses correspondingly either the structure, and/or configuration and/or form and/or positioning of the related component or part thereof, or combinations of components or part thereof, such term refers to.

Figure 8:
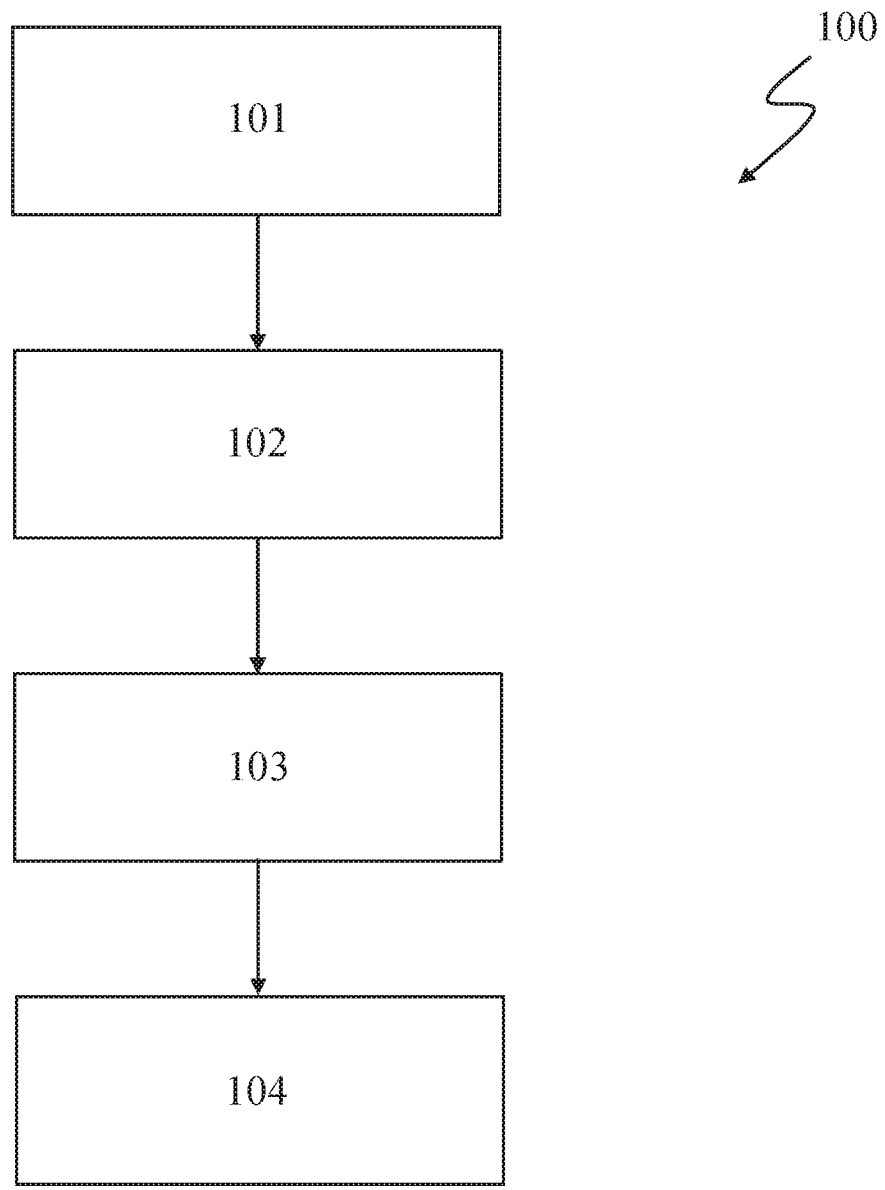
FIG. 8 illustrates a block diagram which depicts a values acquiring method according to the present invention.
Figure 9:
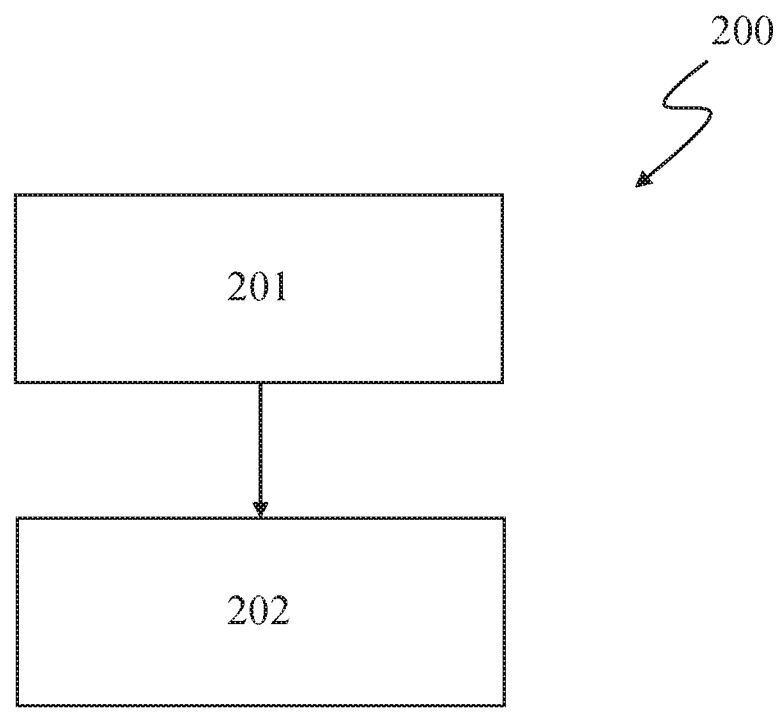
FIG. 9 illustrates a block diagram which depicts a control method according to the present invention.

With reference to FIGS. 8 and 9, the present disclosure is related to a method 100 for acquiring values indicative of an AC current generable by an inverting stage 10 of an inverter 1, and to a method 200 for controlling the AC current generation by using the values acquired by the execution of method 100.

The present invention is also related to an inverter 1 adapted to execute the methods 100 and 200.

FIG. 1 is related to an exemplary single-phase inverter 1 comprising an inverting stage 10 adapted to generate an AC current, and control means 40 which are adapted to control the inverting stage 10 for generating such AC current.

The inverter 1 further comprises a DC input stage 2 adapted to received DC power from one or more DC sources 3, for example photovoltaic or wind modules, and to provide such DC power to the inverting stage 10 for generating the AC current.

The input stage 2 comprises at least a couple of connectors 4 adapted to be operatively connected to the one or more DC sources 3 and a DC/DC converting stage 5, preferably a DC/DC boosting stage 5.

The input stage 2 is realized according to known well-established solutions, readily available to a skilled in the art and hence not further disclosed hereinafter.

The inverter 1 comprises an output stage 20 adapted to be operatively connected to one or more AC loads and/or grids 30 associable to the inverter 1.

According to the exemplary embodiment illustrated in FIG. 1, the output stage 20 comprises at least two connectors 21 adapted to be connected to the AC loads or girds 30 associable to the inverter 1 for receiving AC power.

The inverter 1 further comprising a circuit 50 having at least a first line (herein after indicated for sake of simplicity as "line 52") and a second line (hereinafter indicated for sake of simplicity as "line 51") for providing a path for the AC current generated by the inverting stage 10, between the inverting stage 10 itself and the output stage 20.

In practice, the line 51 and the line 52 are operatively connected, directly or indirectly, to the inverting stage 10 and to the output stage 20 in such a way that the AC generated by the inverting stage 10 can:
- flow towards the output stage 20 by flowing in one of the two lines 51, 52; and
- return from the output stage 20 towards the inverting stage 10 by flowing in the other of the two lines 51, 52.

For example, with reference to the AC current path depicted by a dot-line in FIG. 1, the driving means 40 can drive the inverting stage 10 in such a way that the generated AC current:
- flows through the line 51 directed towards the output stage 20, so as it can further flow to reach and pass through the one or more AC loads or grids 30 connected to the output stage 20 (the AC current, while flowing in the line 51, is hereinafter indicated with reference "$I_1$," which is also used in the attached figures); and
- returns from the one or more AC loads or grids 30 AC towards the inverting stage 10 by flowing in the line 52 (the AC current, while flowing in the line 52, is hereinafter indicated with reference "$I_2$" which is also used in the attached figures).

With reference to FIG. 1, the control means 40 are adapted to control the inverting stage 10 in such a way that:
- the AC current $I_2$, while flowing in the line 52, comprises a high frequency ripple 72 during a first-half $T_1$ of the AC current period T, and it does not comprise a high-frequency ripple during the second-half period $T_2$;
- the AC current $I_1$, while flowing in the line 51, comprises a high-frequency ripple 71 during a second-half $T_2$ of the AC current period T, and it does not comprise a high-frequency ripple during the first-half period $T_1$.

Figure 7:
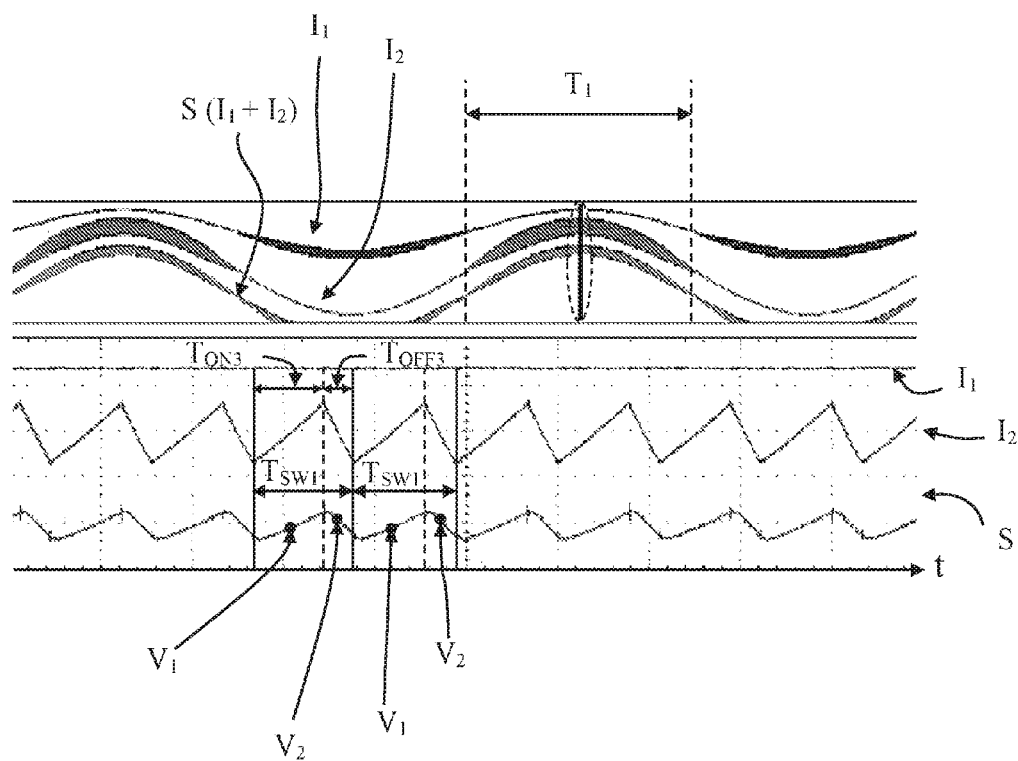

With reference to FIG. 7, the inverter 1 is therefore adapted, through the control means 40, to carry out a step 101 of the acquiring method 100.

This step 101 comprises driving the inverting stage 10 for generating the AC current in such a way that:
- the AC current $I_2$, while flowing in the line 52, comprises the high-frequency ripple 72 during the first-half $T_1$ of the AC current period T, and it does not comprise a high-frequency ripple during the second-half period $T_2$;
- the AC current $I_1$, while flowing in the line 51, comprises the high-frequency ripple 71 during the second-half $T_2$ of the AC current period T, and it does not comprise a high-frequency ripple during the first-half period $T_1$.

Filtering means are used in order to filter the high-frequency ripples 71, 72 of the generated AC current $I_1$, $I_2$, before that such ripples 71, 72 can be applied to the one or more AC loads or grids 30 connected to the output stage 20.

Preferably, the inverter 1 itself comprises such filtering means 80, 81, 82, 83.

In the exemplary embodiment illustrated in FIG. 1, the inverter 1 comprises a fist EMI LC filter having a first inductor 80 and a first capacitor 81 operatively associated to the line 51, wherein the first capacitor 81 is placed at the output stage 20. The inverter 1 further comprises a second EMI LC filter having a second inductor 82 and a second capacitor 83 operatively associated to the line 52, wherein the second capacitor 83 is placed at the output stage 20. Preferably, the capacitors 81, 82 are connected to a point 85 of the DC/DC converting stage 5.

Preferably, according to the exemplary embodiment illustrated in FIG. 1, the inverting stage 10 comprises at least a first circuital branch 12 and a second circuital branch 11 in parallel to each other.

The control means 40 are adapted to turn on/turn off at least one switching device 15, 16 of the circuital branch 12 according to a first predetermined switching period $T_{SW1}$, for a time duration corresponding to the first-half-period $T_1$ of the AC current which to be generated.

The control means 40 are also adapted to turn on/turn off at least one switching device 13, 14 of the circuital branch 11 according to a second predetermined switching period $T_{SW2}$, for a time duration corresponding to the second-half-period $T_2$ of the AC current to be generated.

Preferably, the first switching period $T_{SW1}$ has the same temporal duration as the second switching period $T_{SW2}$.

Hence, the inverter 1 according to the exemplary embodiment illustrated in FIG. 1, is adapted to carry out the step 101 of the method 100, in such a way that this step 101 comprises:
- turning on/turning off at least one switching device 15, 16 of the circuital branch 12 according to a first predetermined switching period $T_{SW1}$, for a time duration corresponding to the first-half-period $T_1$ of the AC current to be generated; and
- turning on/turning off at least one switching device 13, 14 of the circuital branch 11 according to a second predetermined switching period $T_{SW2}$, for a time duration corresponding to the second-half period $T_2$ of the AC current to be generated.

The turning on/off the at least one switching device 13, 14 of the circuital branch 11 causes the high-frequency ripple 71 during the second-half period $T_2$ of the AC current $I_1$, ripple 71 which is periodic according to the switching period $T_{SW2}$.

The turning on/off of the at least one switching device 15, 16 of the circuital branch 12 causes the high-frequency ripple 72 during the first-half period $T_1$ of the AC current $I_2$, ripple 72 which is periodic according to the switching period $T_{SW1}$.

In the exemplary embodiment illustrated in FIG. 1, the circuital branch 12 comprises a first switching device 15 and a second switching device 16 connected in series to each other, and the circuital branch 11 comprises a third switching device 13 and a second switching device 14 connected in series to each other.

With reference to FIG. 1, the control means 40 are preferably adapted to drive the switching device 13 and the second switching device 14 by means of a PWM ("pulse with modulation") signal $S_1$ and a PWM signal $S_2$, respectively, which are opposed to each other and which both have a period corresponding to the switching period $T_{SW2}$.

The PWM signals $S_1$ and $S_2$ are applied to the switching devices 13 and 14 for a time duration equal to each second-half period $T_2$ of the AC current to be generated.

During such time duration, the control means 40 drive the switching device 15 for remaining in an ON state and the switching device 16 for remaining in an OFF state.

In particular, as illustrated in FIG. 1:
- at each one of its switching periods $T_{SW2}$ the PWM signal $S_1$ is at an high level for a switching-on time $T_{ON1}$ (switching device 13 in ON state) and at a low level for a switching-off time $T_{OFF1}$ (switching device 13 in OFF state); and
- at each one of its switching periods $T_{SW2}$ the PWM signal $S_2$ is at an high level for a switching-on time $T_{ON2}$ (switching device 14 in ON state) and at a low level for a switching-off time $T_{OFF2}$ (switching device 14 in OFF state).

The PWM signal $S_1$ and the PWM signal $S_2$ are opposed, i.e. while the PWM signal $S_1$ is at the high level during a corresponding switching-on time $T_{ON1}$ the PWM signal $S_2$ is at the low level during a corresponding switching-off time $T_{OFF2}$, and while the PWM signal $S_1$ at the low level during a corresponding switching-off time $T_{OFF1}$ the PWM signal $S_2$ is at the high level during a corresponding switching-one time $T_{ON2}$.

With reference to FIG. 1, the control means 40 are also preferably adapted to drive the switching device 15 and the switching device 16 by means of a PWM signal $S_3$ and a PWM signal $S_4$, respectively, which are opposed to each other and which both have a period corresponding to the switching period $T_{SW1}$.

The PWM signals $S_3$ and $S_4$ are applied to the switching devices 15 and 16, respectively, for a time duration equal to each first-half period $T_1$ of the AC current to be generated.

During such time duration, the control means 40 drive the switching device 13 for remaining in an ON state and the switching device 14 for remaining in an OFF state.

In particular, as illustrated in FIG. 1:
at each one of its switching periods $T_{SW1}$ the PWM signal $S_3$ is at an high level for a switching-on time $T_{ON3}$ (switching device 15 in ON state) and at a low level for a switching-off time $T_{OFF3}$ (switching device 15 in OFF state);
at each one of its switching periods $T_{SW1}$ the PWM signal $S_4$ is at an high level for a switching-on time $T_{ON4}$ (switching device 16 in ON state) and at a low level for a switching-off time $T_{OFF4}$ (switching device 16 in OFF state).

The PWM signal $S_3$ and the PWM signal $S_4$ are opposed, i.e. while the PWM signal $S_3$ is at the high level during a corresponding switching-on time $T_{ON3}$ the PWM signal $S_4$ is at the low level during a corresponding switching-off time $T_{OFF4}$, and while the PWM signal $S_3$ is at the low level during a corresponding switching-off time $T_{OFF3}$ the PWM signal $S_4$ is at the high level during a corresponding switching-one time $T_{ON4}$.

Hence, the inverter 1 according to the exemplary embodiment illustrated in FIG. 1, is adapted to carry out the step 101 of the method 100 in such a way that such step comprises:
driving the switching device 13 and the switching device 14 by means of the PWM signal $S_1$ and the PWM signal $S_2$, respectively, which are opposed to each other and which are periodic according to the switching period $T_{SW2}$; and
driving the switching device 15 and the switching device 16 by means of the PWM signal $S_3$ and the PWM signal $S_4$, respectively, which are opposed to each other and which are periodic according to the switching period $T_{SW1}$.

The ratio between the switching-on time $T_{ON1}$ and the switching period $T_{SW2}$ defines the duty cycle of the PWM signal $S_1$; the ratio between the switching-on time $T_{ON2}$ and the switching period $T_{SW2}$ defines the duty cycle of the PWM signal $S_2$; the ratio between the switching-on time $T_{ON3}$ and the switching period $T_{SW1}$ defines the duty cycle of the PWM signal $S_3$; and the ratio between the switching-on time $T_{ON4}$ and the switching period $T_{SW1}$ defines the duty cycle of the PWM signal $S_4$.

Figure 2:
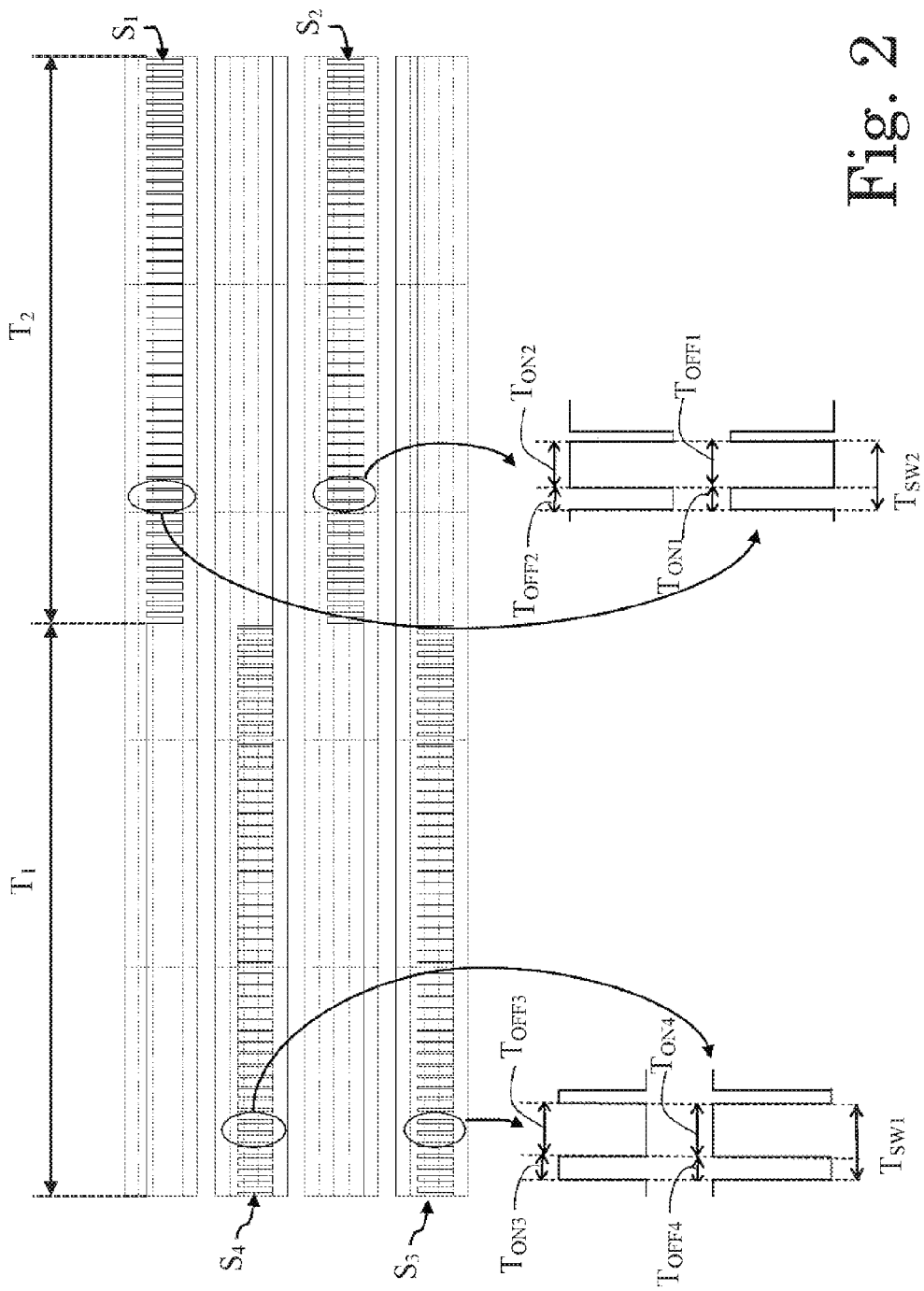
FIG. 2 shows signals adapted to be used for driving an inverting stage of the inverter schematically illustrated in FIG. 1.

The control means 40 are adapted to vary the duty cycles of the PWM signals $S_1$-$S_4$ at each switching time $T_{SW1}$, $T_{SW2}$, as illustrated in FIG. 2. This changing of the duty cycles in such that the AC current to be generated has substantially a sinusoidal behavior with a sinusoidal frequency corresponding to the requirements of the AC load or grid 30, typically 50 Hz or 60 Hz. The above disclosed driving technique of the switching device $S_1$-$S_4$ is suitable for optimizing the conversion efficiency of the exemplary single-phase inverter 1.

With reference to FIG. 1, the circuit 50 comprising the lines 51, 52 further comprises one current sensor 60. Advantageously, this sensor 60 is operatively associated to the lines 51, 52 and configured in such a way to generate a signal S as a function of the sum between the AC current $I_1$ flowing in the line 51 and the AC current $I_2$ flowing in the line 52.

With reference to FIG. 8, the inverter 1 is adapted, by means of the circuit 50, to carry out a step 102 of the method 100. In particular, this step 102 comprises generating a signal S as a function of the sum between the AC current $I_1$ flowing in the line 51 and the AC current $I_2$ flowing in the line 52.

Figure 5:
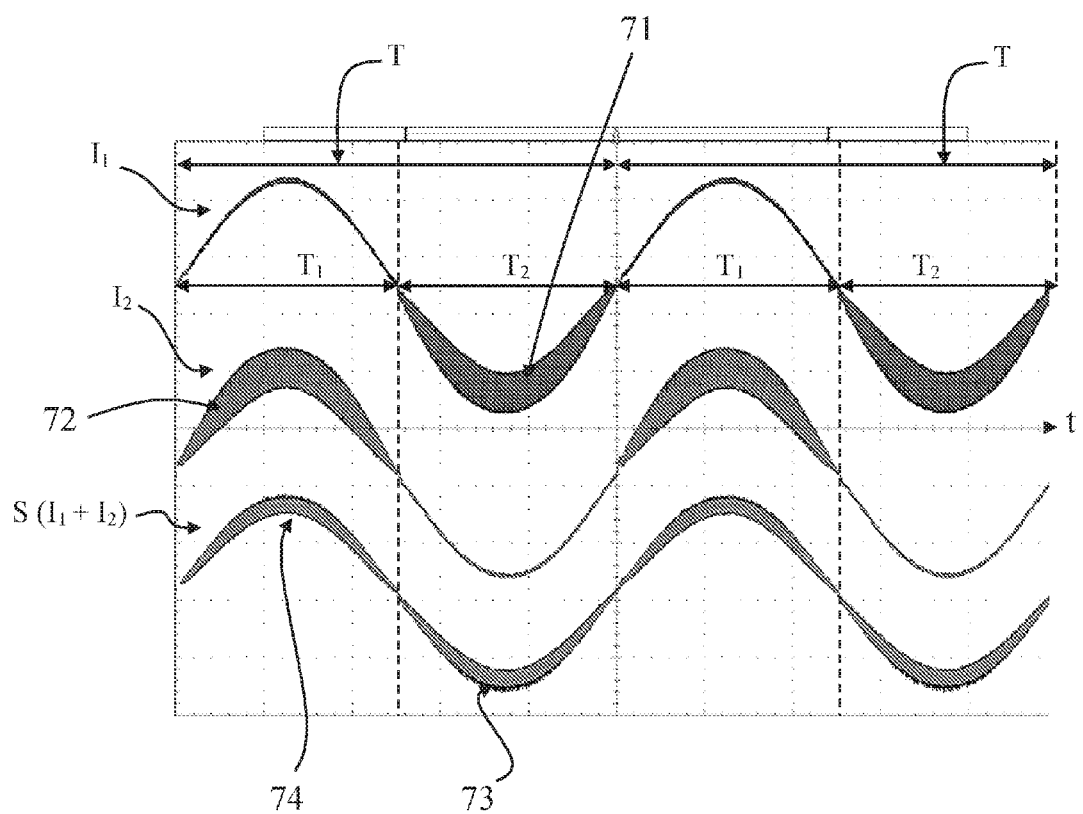
FIG. 5 illustrates a waveform of an AC current flowing in a first line and in a second line of the inverter of FIG. 1, and a waveform of an output signal generated by a current sensor operatively associated to such first and second lines.

FIG. 5 illustrates an example of the signal S outputted by the sensor 60 in reply of two consecutive periods T of the AC current generated by the inverting stage 10 and flowing in the lines 51, 52.

Since the signal S is a function of the sum between the AC current $I_1$ flowing in the line 51 and the AC current $I_2$ flowing in the line 52, such signal S:
keeps the periodicity of the AC current generated by the inverting stage 10 and flowing in the lines 51, 52;
contains a high-frequency ripple 73 during the second-half periods $T_2$, which is due to the high-frequency ripple 71 of the AC current $I_1$; and
contains a high-frequency ripple 74 during the first-half periods $T_1$, due to the high-frequency ripple 72 of the AC current $I_2$.

With reference to the exemplary current path illustrated by dot-line in FIG. 1, the line 51 and the line 52 are preferably arranged in such a way that, at the input of the current sensor 60, the flowing direction of the AC current $I_1$ along the line 51 is the same of the flowing direction of the AC current $I_2$ along the line 52.

In this way, a current sensor 60 can be used which is adapted to generate an output signal in response of the magnetic filed which is produced by the electromagnetic combination of the AC current $I_1$ and the AC current $I_2$ at the input of and passing through the sensor 60. Indeed, since the AC current $I_1$ and the AC current $I_2$ have the same direction at the input of and while flowing in the sensor 60, the output signal S is a function of the sum between the AC current $I_1$ and the AC current $I_2$. A non limiting example of a current sensor of this type is an Hall current sensor 60 which is adapted to generate in output the voltage signal S based on the sum of the AC current $I_1$ flowing in the line 51 and the AC current $I_2$ flowing in the line 52.

Figure 4:
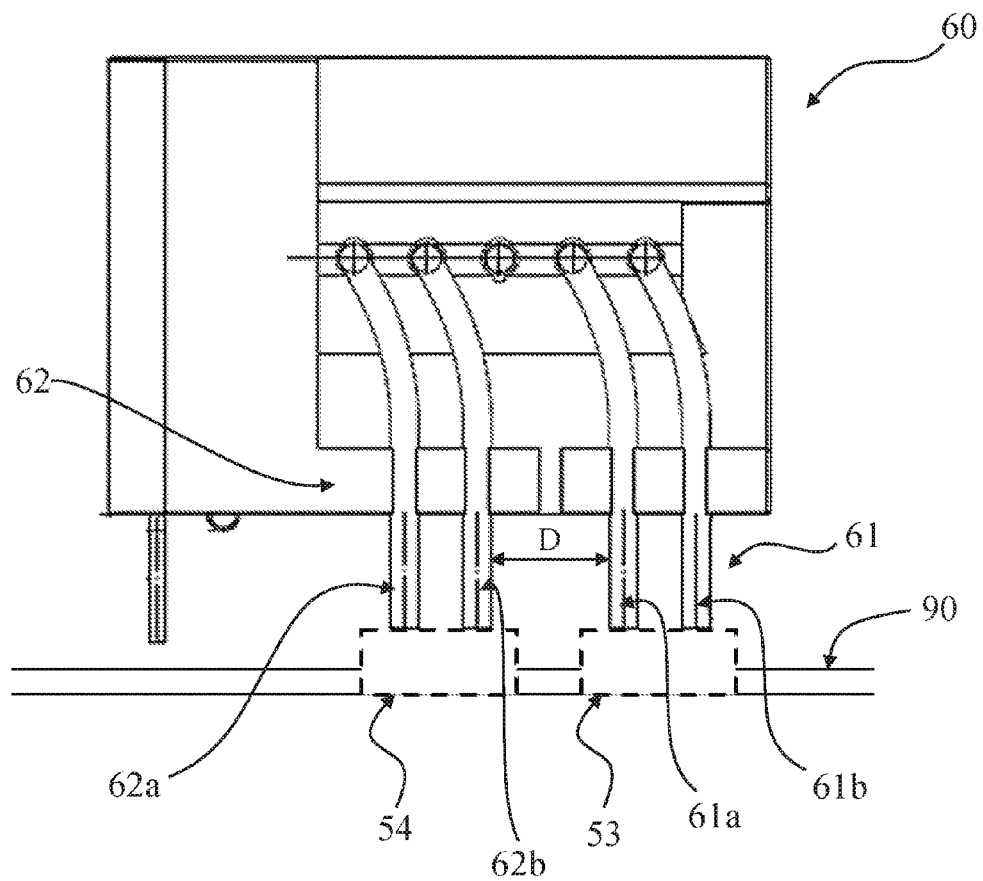
FIG. 4 is a side view of a current sensor adapted to be used in an inverter according to the present invention.

Preferably, the line 51 and the line 52 comprise at least a conductive track 53 and a conductive track 54, respectively, which are only viewable schematically by dot-lines in FIG. 4. In particular, with reference to the exemplary embodiment of FIG. 4, these second conductive tracks 53, 54 are placed on a printed circuit board 90 ("PCB") and are separated from each other by a predetermined distance.

The current sensor 60 is mounted on the PCB 90 and comprises connecting means 61 and connecting means 62. Advantageously, the connecting means 61 and the connecting means 62 are separated from each other by a minimum distance D in such a way that the connecting means 61 and the connecting means 62 are adapted to be operatively connected to the conductive track 53 and the conductive track 54, respectively.

For example, in the embodiment illustrated in FIG. 4 the connecting means 61 comprise at least a first pin 61a and a second pin 61b, while the connecting means 62 comprise at least a third pin 62a and fourth a pin 62b.

A minimum distance D is devised between the illustrated pins 61a and 62b. Such distance D is dimensioned according to the predetermined distance between the conductive tracks 53 and 54, in such a way that the couple of pins 61a, 61b can be electrically connected to the conductive track 53 and the couple of pins 62a, 62b can be electrically connected to the conductive track 54. Even not illustrated in FIG. 4, at the other side of the current sensor 60 (opposed to the illustrated side), the connecting means 61 comprise a fifth pin and a sixth pin, while the connecting means 62 comprises a seventh pin and an eight pin. A minimum distance D is also devised between the couple of fifth and sixth pins and the couple of seventh and eighth pins, in such a way that the fifth and sixth pins and the seventh and eight pins can be connected to respective conductive tracks of the line 51 and the line 52, respectively.

In this way, the AC current $I_1$ can pass along the sensor 60 through the pins of the means 61 connected to respective conductive tracts of the line 51, and the AC current $I_2$ can pass along the sensor 60 through the pins of the means 62 connected to respective conductive tracts of the line 52.

Figure 3:
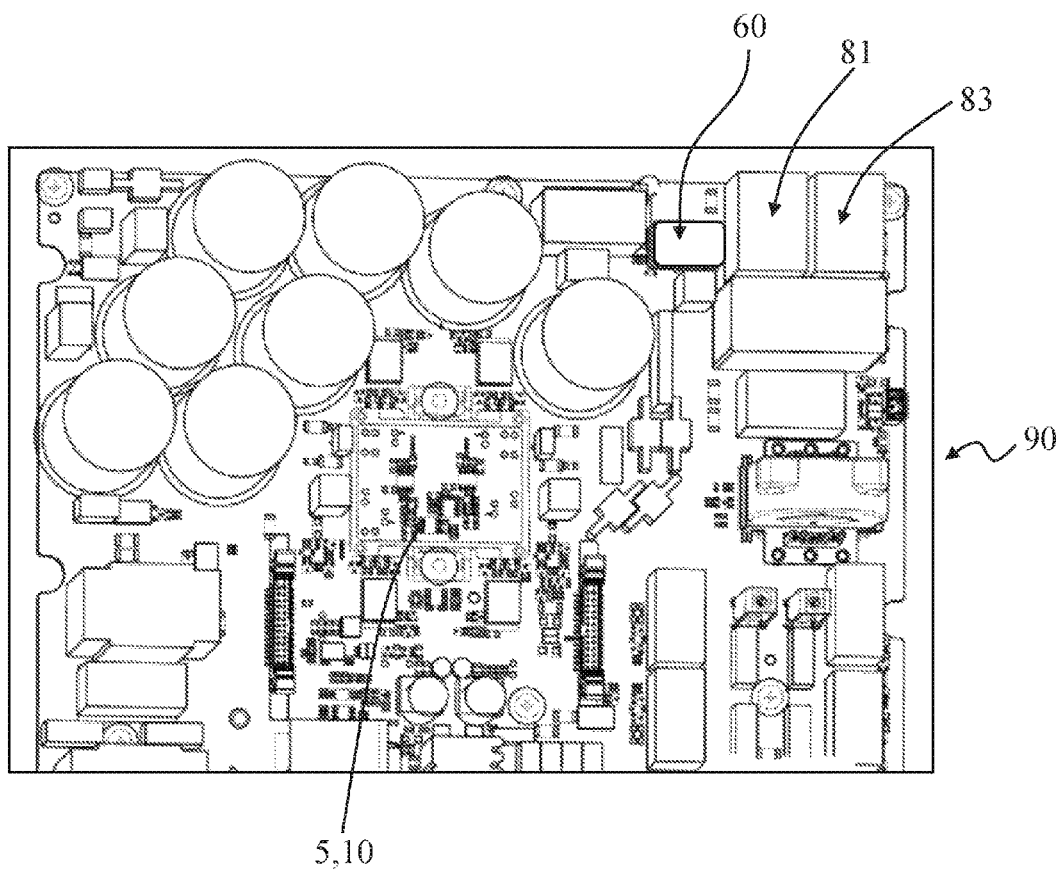
FIG. 3 illustrates a printed circuit board with circuital elements adapted to be used in an inverter for carrying out a method according to the present invention.

According to the exemplary embodiment illustrated in FIG. 3, on the PCB 90 can also be mounted other electric and/or electronic elements of the inverter 1, such as for example the elements of the inverting stage 10 and/or the elements of the boosting stage 5 and/or the capacitors 81, 83 and/or the AC connectors 21.

With reference to FIG. 8, the method 100 further comprises the step 103 of sampling values $V_1$-$V_4$ of the generated signal S during each first-half period $T_1$ and each second-half-period $T_2$ of the AC current.

These sampled values $V_1$-$V_4$ are acquired values indicative of the AC current generated by the inverting stage 10, which can be used for acquiring, e.g. through calculations based on them, further values indicative of the generated AC current.

Figure 6:
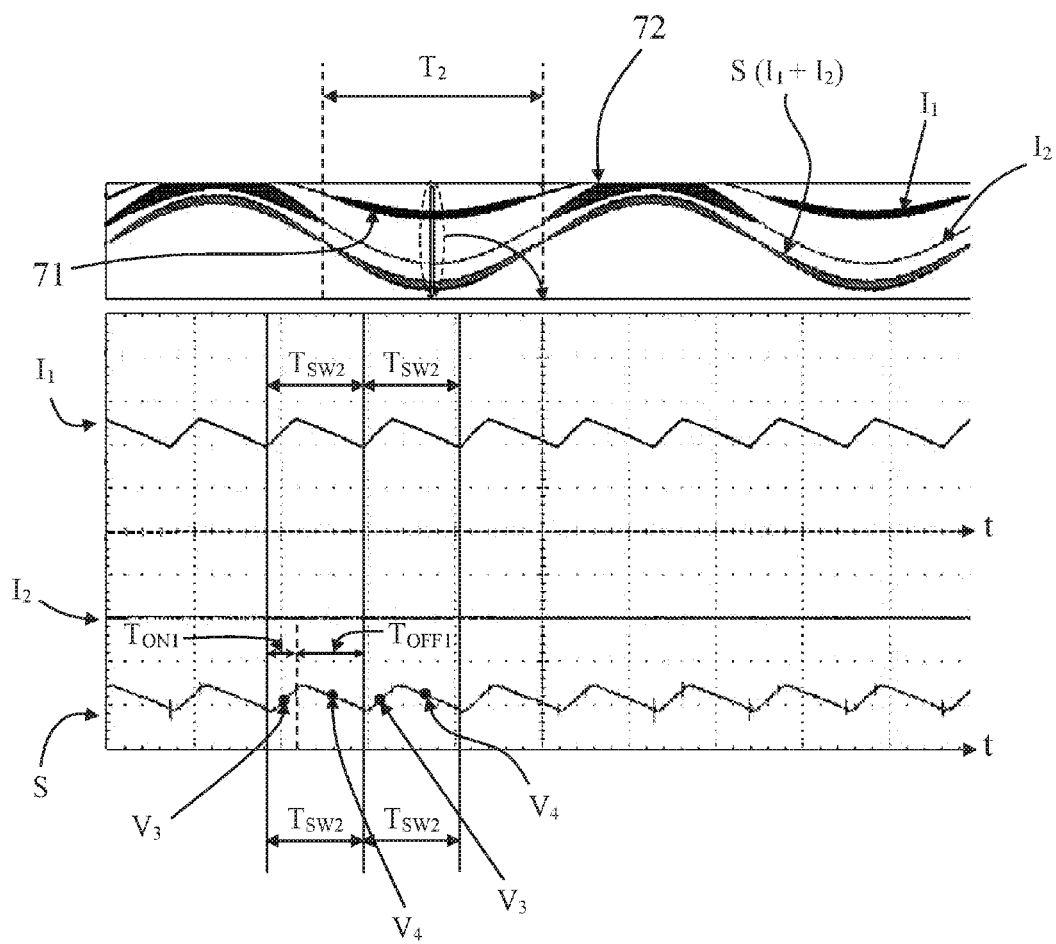
FIGS. 6 and 7 illustrate a zoom of the waveforms illustrated in FIG. 5.

With reference to the examples illustrated in FIGS. 6 and 7, the step 103 preferably comprises:
sampling at least a value $V_1$, $V_2$ of the generated signal S at the half of the on-switching time $T_{ON1}$ and/or at the half of the off-switching time $T_{OFF1}$ of each switching period $T_{SW1}$ within the first-half-period $T_1$;
sampling at least a value $V_3$, $V_4$ of the generated signal S at the half of the on-switching time $T_{ON1}$ and/or at the half of the off-switching time $T_{OFF1}$ of each switching period $T_{SW2}$ within the second-half-period $T_2$.
More preferably, the step 103 comprises:
sampling a value $V_1$ of the generated signal S at the half of the on-switching time $T_{ON3}$ and a value $V_4$ at the half of the off-switching time $T_{OFF3}$ of each switching period $T_{SW1}$ within the first-half period $T_1$; and
sampling a value $V_3$ of the generated signal S at the half of the on-switching time $T_{ON3}$ and a value $V_4$ at the half of the off-switching time $T_{OFF3}$ of each switching period $T_{SW2}$ within the second-half-period $T_2$.
In this case, the method 100 preferably further comprises the step 104 of calculating an average value between the values $V_1$, $V_2$ sampled at each second switching time $T_{SW1}$ within the first-half-period $T_1$, and an average value between the values $V_3$ and $V_4$ sampled at each switching time $T_{SW2}$ within the second-half-period $T_2$.

The average values calculated using the sampled values $V_3$ and $V_4$ are acquired values which are indicative of the average AC current $I_1$ flowing in the line 51 during each switching time $T_{SW2}$. The average values calculated using the sampled values $V_1$ and $V_2$ are acquired values which are indicative of the average AC current $I_2$ flowing in the line 52 during each switching time $T_{SW1}$. According to the exemplary embodiment illustrated in FIG. 1, the inverter 1 comprises sampling means 300 which are adapted to carry out the method step 102, in particular the method 102 according to its preferred above disclosed implementations.

Further, the inverter 1 illustrated for example in FIG. 1 comprises calculating means 400 which are adapted to carry out the method step 103.

With reference to FIG. 9, the control method 200 comprises the step 201 of executing the method 100 for acquiring values indicative of the generated AC current, and the step 202 of using the values acquired by the execution of method 100 as feedback measurements for controlling the generation of the AC current by the inverting stage 10.

In order to carry out the method step 201, the control means 40 of the inverter 1 are adapted to use the values acquired by the execution of the method 100 as feedback measurements for controlling the generation of the AC current by the inverting stage 10.

For example, the control means 40 are adapted to use as feedback measurements the average values between the values $V_1$ and $V_2$ sampled at each switching time $T_{SW1}$, and the average values between the values $V_3$ and $V_4$ sampled at each second switching time $T_{SW2}$.

In this way, at each first switching time $T_{SW1}$, the control means 40 are adapted to receive a value indicative of the AC average current during the switching time $T_{SW1}$, and they are adapted to use this received value for adjusting the following duty cycle of the PWM signals $S_3$ and $S_4$ according to a desired current target value.

At each second switching time $T_{SW2}$, the control means 40 are adapted to receive a value indicative of the AC average current during the second switching time $T_{SW2}$, and they are adapted to use this received value for adjusting the following duty cycle of the PWM signals $S_1$ and $S_2$ according to a desired current target value.

In practice, it has been seen how the circuit 50 and related inverter 1 and the methods 100, 200 allow some improvements over known solutions.

In particular, the circuit 50 used in an inverter 1 allows the execution of the methods 100, 200 by using only one current sensor 60.

Hence, the costs are greatly reduced while keeping a good accuracy in the acquisition of values associated to the AC current generated by the inverter 1.

Indeed, even if the AC current $I_1$ flowing in the line 51 comprises the high-frequency ripple content 71 only during the second-half periods $T_2$ and the AC current $I_2$ flowing in the line 52 comprises the high-frequency ripple content 72 only during the first-half periods $T_2$, the signal S outputted by the current sensor 60 comprises high-frequency ripples 73 and 74 in both the half-periods $T_1$, $T_2$.

In this way, the signal S can be advantageously sampled during both the half-periods $T_1$, $T_2$, preferably at each first switching time $T_{SW1}$ and at each second switching time $T_{SW2}$, where the signal S has the high slopes of the ripples 73, 74 (high slopes which improves the sampling accuracy).

The circuit 50, inverter 1 and methods 100, 200 thus conceived are also susceptible of modifications and variations, all of which are during the scope of the inventive concept as defined in particular by the appended claims.

For example, even if the exemplary inverter 1 schematically illustrated in FIG. 1 is a single-phase inverter 1, the inverter 1 according to the present invention can be a multi-phase inverter 1 if in each one of its phases a driving technique as the technique described in the above description is used for generating the AC current.

For example, the current sensor 60 can be any sensor 60 which can be operatively associated to the first and second lines 51, 52 in order to generate the signals S as a function of the sum between the AC current $I_1$ flowing in the line 51 and the AC current $I_2$ flowing in the line 52.

The control means 40 preferably comprise one or more digital signal processors (DSPs). In addition or alternatively, the control means 40 may comprise: microcontrollers, microcomputers, minicomputers, optical computers, complex instruction set computers, application specific integrated circuits, a reduced instruction set computers, analog computers, digital computers, solid-state computers, single-board computers, or a combination of any of these.

Even if in the exemplary embodiment illustrated in FIG. 1 the control means 40, the sampling means 300 and the calculating means 400 are illustrated as separated elements operatively connected to each other, all these elements of a part thereof can be integrated in a single electronic unit or circuit.

In practice, all parts/components can be replaced with other technically equivalent elements; in practice, the type of materials, and the dimensions, can be any according to needs and to the state of the art.

The invention claimed is:

1. A method for acquiring values indicative of an AC current generable by an inverting stage of an inverter, said inverter comprising:
    an output stage adapted to be operatively connected to one or more AC grids or loads;
    at least a first line and a second line for providing a path for said AC current between said inverting stage and said output stage;
    a current sensor operatively associated to said first line and second line and configured in such a way to generate a signal as a function of the sum between the AC current flowing in the first line and the AC current flowing in the second line; said method comprising:
    a) driving said inverting stage for generating said AC current in such a way that said AC current ($I_2$), while flowing in said first line, comprises a first high-frequency ripple during a first-half of the period of the AC current, and in such a way that said AC current, while flowing in the second line, comprises a second high-frequency ripple during a second-half of the period of the AC current;
    b) generating, through said current sensor, said signal as a function of the sum between the AC current flowing in the first line and the AC current flowing in the second line; and
    c) sampling values of said generated signal during said first-half period and said second-half period.

2. The method according to claim 1, wherein said inverting stage comprises at least a first circuital branch and a second circuital branch in parallel to each other, and wherein said step a) comprises:
    turning on/turning off at least one switching device of the first circuital branch according to a first predetermined switching period, for a time duration corresponding to said first-half-period;
    turning on/turning off at least one switching device of the second circuital branch according to a second predetermined switching period, for a time duration corresponding to said second-half-period;
    and wherein said step c) comprises:
    sampling at least one value of said generated signal during each first switching time within said first-half-period; and
    sampling at least one value of said generated signal during each second switching time within said second-half-period.

3. The method according to claim 2, wherein said at least one switching device of the first circuital branch comprises at last a first switching device and a second switching device which are connected in series, wherein said at least one switching device of the second circuital branch comprises at least a third switching device and a fourth switching device which are connected in series, and wherein:
    said turning on/off the at least one switching device of the first circuital branch comprises driving said first switching device and said second switching device by means of a first PWM signal and a second PWM signal, respectively, which are opposed to each other and which have a time period corresponding to said first switching period; and
    said turning on/off the at least one switching device of the second circuital branch comprises driving said third switching device and said fourth switching device by means of a third PWM signal and a fourth PWM signal, respectively, which are opposed to each other and which have a time period corresponding to said second switching period.

4. The method according to claim 3, wherein said first switching period and said second switching period each comprise an on-switching time and an off-switching time, and wherein said step c) comprises:
    sampling at least a value of said generated signal at the half of said on-switching time and/or at the half of said off-switching time of each first switching period within said first-half-period; and
    sampling at least a value of said generated signal at the half of said on-switching time and/or at the half of said off-switching time of each second switching period within said second-half-period.

5. The method according to claim 4, wherein said step c) comprises:
    sampling a first value of said generated signal at the half of said on-switching time and a second value of said generated signal at the half of said off-switching time of each first switching period within said first-half period; and
    sampling a third value of said generated signal at the half of said on-switching time and a second value of said generated signal at the half of said off-switching time of each second switching period within said first-half-period;
    and wherein said method further comprises:
    d) calculating an average value between said first and second values and an average value between said third and fourth values.

6. The method according to claim 1, further comprising:
    using the acquired values for providing feedback measurements for controlling the generation of the AC current by said inverting stage.

7. An inverter, said inverter comprising at least an inverting stage adapted to generate an AC current, an output stage adapted to be operatively connected to one or more AC electrical girds or loads, and a circuit comprising at least a first line and a second line for providing a path for said AC current between said inverting stage and said output stage, characterized in that it comprises a current sensor which is operatively associated to said first and second lines and configured in such a way to generate a signal as a function of the sum between the AC current flowing in the first line and the AC current flowing in the second line.

8. The inverter according to claim 7, wherein said first line and said second line are arranged in such a way that at the input of the current sensor a flowing direction of the AC current along the first line is the same of a flowing direction of the AC current along the second line.

9. The inverter according to claim 7, wherein:
said first line and said second line comprise at least a first conductive track and a second conductive track, respectively, defined in a printed circuit board and separated from each other by a predetermined distance; and
said, current sensor comprises first connecting means and second connecting means which are separated from each other in such a way that the first connecting means and said second connecting means are adapted to be operatively connected to said first conductive track and to said second conductive track, respectively.

10. The inverter according to claim 7, further comprising:
control means adapted to control said inverting stage;
wherein said control means are adapted to control said inverting stage in such a way that the AC current, while flowing in the first line of said circuit, comprises a first high-frequency ripple during a first-half of the period of the AC current, and in such a way that the AC current, while flowing in the second line of said circuit, comprises a second high frequency ripple during a second-half of the period of the AC current, and wherein said inverter comprises means for sampling values of said signal generated by said current sensor during said first-half period and said second-half period.

11. The inverter according to claim 10, wherein said inverting stage comprises at least a first circuital branch and a second circuital branch in parallel to each other, and wherein said control means are adapted to:
turn on/turn off at least one switching device of the first circuital branch according to a first predetermined switching period, for a time duration corresponding to said first-half period;
turn on/turn off at least one switching device of the second circuital branch according to a second predetermined switching period, for a time duration corresponding to said second-half-period;
and wherein said sampling means are adapted to:
sample at least one value of said generated signal during each first switching time within said first-half period;
sample at least one value of said generated signal during at each second switching time within said second-half period.

12. The inverter according to claim 11, wherein said at least one switching device of the first circuital branch comprises at last a first switching device and a second switching device connected in series, wherein said at least one switching device of the second circuital branch comprises at least a third switching device and a fourth switching device electrically connected in series, and wherein said control means are adapted to:
drive said first switching device and said second switching device by means of a first PWM signal and a second PWM signal, respectively, which are opposed to each other and which have a period corresponding to said first switching period; and
drive said third switching device and said fourth switching device by means of a third PWM signal and a fourth PWM signal, respectively, which are opposed to each other and which have a period corresponding to said second switching period.

13. The inverter according to claim 12, wherein said first switching period and said second switching period each comprise an on switching time and an off-switching time, and wherein said sampling means are adapted to:
sample at least a value of said generated signal at the half of said on-switching time and/or at the half of said off-switching time of each first switching period within said first-half period; and
sample at least a value of said generated signal at the half of said on switching time and/or at the half of said off-switching time of each second switching period within said second-half-period.

14. The inverter according to claim 9, wherein said sampling means are adapted to:
sample a first value of said generated signal at the half of said on-switching time and a second value of said generated signal at the half of said off-switching time of each first switching period within said first-half period;
sample a third value of said generated signal at the half of said on-switching time and a second value of said generated signal at the half of said off-switching time of each second switching period within said second-half period;
and wherein said inverter comprises means for calculating an average of said first and second sampled values and an average of said third and fourth sampled values.

15. The inverter according to claim 10, wherein said control means are adapted to use the sampled values for obtaining feedback measurements in order to control the generation of the AC current by the inverting stage.

16. The inverter according to claim 10, comprising filtering means adapted to filter at least the high frequency ripple of the AC current flowing in the first line and the high frequency ripple of the AC current flowing in the second line, at the output stage.

17. The inverter according to claim 10, wherein said control means are adapted to use the sampled values for obtaining, feedback measurements in order to control the generation of the AC current by the inverting stage; and
comprising filtering means adapted to filter at least the high frequency ripple of the AC current flowing in the first line and the high frequency ripple of the AC current flowing in the second line, at the output stage.

18. The inverter according to claim 7, wherein said first line and said second line are arranged in such a way that at the input of the current sensor a flowing direction of the AC current along the first line is the same of a flowing direction of the AC current along the second line;
wherein:
said first line and said second line comprise at least a first conductive track and a second conductive track, respectively, defined in a printed circuit board and separated from each other by a predetermined distance; and
said current sensor comprises first connecting means and second connecting means which are separated from each other in such a way that the first connecting means and said second connecting means are adapted to be operatively connected to said first conductive track and to said second conductive track, respectively; and
further comprising:
an inverting stage adapted to generate an AC current;
an output stage adapted to be operatively connected to one or more AC electrical grids or loads;
control means adapted to control said inverting stage;

wherein said control means are adapted to control said inverting stage in such a way that the AC current, while flowing in the first line of said circuit, comprises a first high-frequency ripple during a first-half of the period of the AC current, and in such a way that the AC current, while flowing in the second line of said circuit, comprises a second high frequency ripple during a second-half of the period of the AC current, and wherein said inverter comprises means for sampling values of said signal generated by said current sensor during said first-half period and said second-half period.

19. The inverter according to claim 18, wherein said inverting stage comprises at least a first circuital branch and a second circuital branch in parallel to each other, and wherein said control means are adapted to:
turn on/turn off at least one switching device of the first circuital branch according to a first predetermined switching period, for a time duration corresponding to said first-half period;
turn on/turn off at least one switching device of the second circuital branch according to a second predetermined switching period for a time duration corresponding to said second-half-period;
and wherein said sampling means are adapted to:
sample at least one value of said generated signal during each first switching time within said first-half period;
sample at least one value of said generated signal during at each second switching time within said second-half period;
wherein said at least one switching device of the first circuital branch comprises at last a first switching device and a second switching device connected in series, wherein said at least one switching device of the second circuital branch comprises at least a third switching device and a fourth switching device electrically connected in series, and wherein said control means are adapted to:
drive said first switching device and said second switching device by means of a first PWM signal and a second PWM signal, respectively, which are opposed to each other and which have a period corresponding to said first switching period; and
drive said third switching device and said fourth switching device by means of a third PWM signal and a fourth PWM signal, respectively, which are opposed to each other and which have a period corresponding to said second switching period;
wherein said first switching period and said second switching period each comprise an on-switching time and an off-switching time, and wherein said sampling means are adapted to:
sample at least a value of said generated signal at the half of said on-switching time and/or at the half of said off-switching time of each first switching period within said first-half period; and
sample at least a value of said generated signal at the half of said on-switching time and/or at the half of said off-switching time of each second switching period within said second-half-period; and
wherein said sampling means are adapted to:
sample a first value of said generated signal at the half of said on-switching time and a second value of said generated signal at the half of said off-switching time of each first switching period within said first-half period;
sample a third value of said generated signal at the half of said on-switching time and a second value of said generated signal at the half of said off-switching time of each second switching period within said second-half period;
and wherein said inverter comprises means for calculating an average of said first and second sampled values and an average of said third and fourth sampled values.

20. The inverter according to claim 19, wherein said control means are adapted to use the sampled values for obtaining feedback measurements in order to control the generation of the AC current by the inverting stage; and
comprising filtering means adapted to filter at least the high frequency ripple of the AC current flowing in the first line and the high frequency ripple of the AC current flowing in the second line, at the output stage.

* * * * *